US006784061B1

(12) United States Patent
Yang et al.

(10) Patent No.: US 6,784,061 B1
(45) Date of Patent: Aug. 31, 2004

(54) PROCESS TO IMPROVE THE VSS LINE FORMATION FOR HIGH DENSITY FLASH MEMORY AND RELATED STRUCTURE ASSOCIATED THEREWITH

(75) Inventors: Nian Yang, San Jose, CA (US); John Jianshi Wang, San Jose, CA (US); Hyeon-Seag Kim, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 171 days.

(21) Appl. No.: 10/179,723

(22) Filed: Jun. 25, 2002

(51) Int. Cl.[7] .................. H01L 21/336; H01L 29/76
(52) U.S. Cl. .................. 438/279; 438/257; 438/587; 438/588; 438/599; 257/314; 257/315; 257/390; 257/211
(58) Field of Search .................. 438/599, 257, 438/279, 387, 588; 257/211, 314, 315, 390

(56) References Cited

U.S. PATENT DOCUMENTS

| 5,103,274 A | | 4/1992 | Tang et al. | |
|---|---|---|---|---|
| 5,534,455 A | | 7/1996 | Liu | |
| 6,060,740 A | * | 5/2000 | Shimizu et al. | 257/314 |
| 6,080,624 A | * | 6/2000 | Kamiya et al. | 438/257 |
| 2002/0179958 A1 | * | 12/2002 | Kim | 257/314 |

* cited by examiner

Primary Examiner—George Fourson
Assistant Examiner—Thanh Pham

(57) ABSTRACT

One aspect of the invention relates to a method of a NOR-type flash memory and associated structure which comprises forming a flash memory array on a semiconductor substrate in a core region of the flash memory. The flash memory array comprises a plurality of flash memory cells which each have a source region and a drain region in the semiconductor substrate. A first portion of a first dielectric layer is formed over the flash memory array, and contact holes in the first dielectric layer are formed down to source regions of flash memory cells in the core region. A trench is then formed in the first dielectric layer and extends between the two contact holes. The contact holes and trench are then filled with a conductive material, thereby electrically coupling together the source regions of the two flash memory cells. A second portion of the first dielectric layer is then formed over the first portion of the first dielectric layer and the trench, thereby embedding the source contacts and trench in within the first dielectric layer.

25 Claims, 10 Drawing Sheets

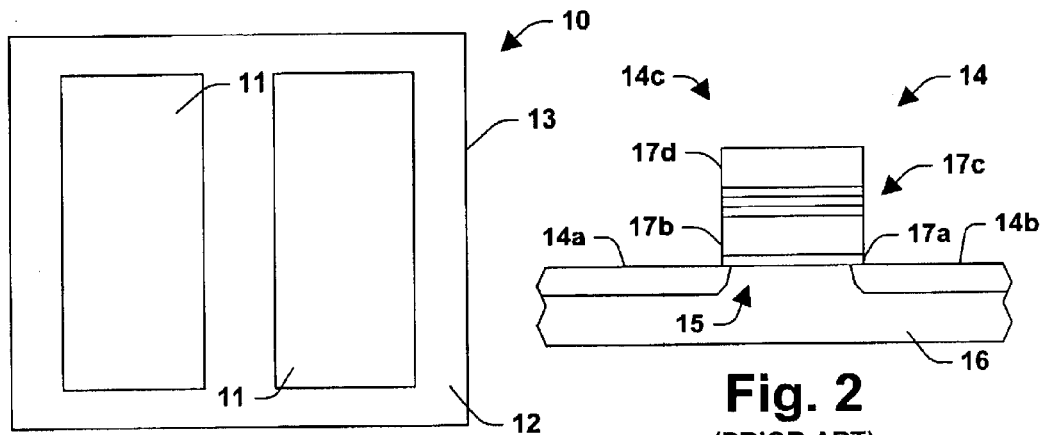
Fig. 1A
(PRIOR ART)
Fig. 2
(PRIOR ART)
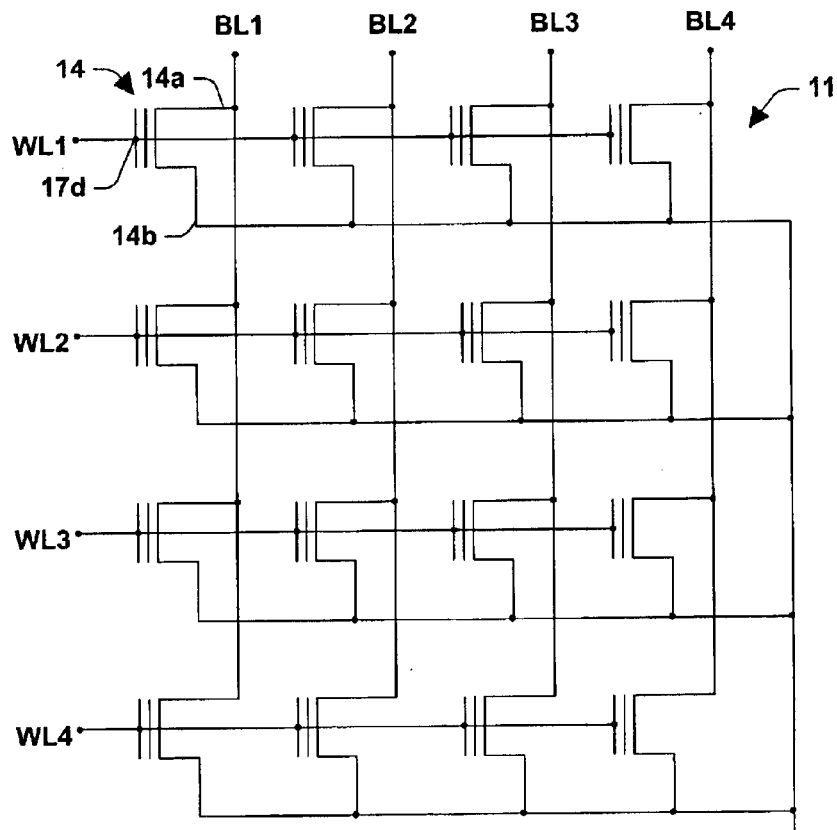
Fig. 1B
(PRIOR ART)

PROCESS TO IMPROVE THE VSS LINE FORMATION FOR HIGH DENSITY FLASH MEMORY AND RELATED STRUCTURE ASSOCIATED THEREWITH

TECHNICAL FIELD OF THE INVENTION

The present invention relates generally to semiconductor device manufacturing and more particularly to methods of manufacturing flash memory devices.

BACKGROUND OF THE INVENTION

Flash memory devices are a type of EEPROM (Electrically Erasable to Programmable Read-Only Memory). The term "flash" refers to the ability of the memory to be erased in blocks. Flash memory devices typically include multiple individual components formed on or within a substrate. Such devices often comprise a high density section and a low density section. For example, as illustrated in prior art FIG. 1A, a memory device such as a flash memory 10 comprises one or more high density core regions 11 and a low density peripheral portion 12 on a single substrate 13. The high density core regions 11 typically consist of at least one MxN array of individually addressable, substantially identical floating-gate type memory cells and the low density peripheral portion 12 typically includes input/output (I/O) circuitry and circuitry for selectively addressing the individual cells (such as decoders for connecting the source, gate and drain of selected cells to predetermined voltages or impedances to affect designated operations of the cell such as programming, reading or erasing).

While there are myriad ways of configuring flash memory devices, in one common configuration sometimes called a NOR architecture, the drain regions of each memory cell (transistor) have a contact and are connected in rows forming bit lines, for example, the configuration illustrated in prior art FIG. 1B. Each memory cell 14 has a drain 14a, a source 14b and a stacked gate 14c.

The NOR configuration illustrated in FIG. 1B has each drain terminal 14a of the transistors within a single column connected to the same bit line (BL). In addition, each flash cell 14 has its stacked gate terminal 14c coupled to a different word line (WL) while all the flash cells in the array have their source terminals 14b coupled to a common source terminal (CS). In operation, individual flash cells may be individually addressed via the respective bit line and word line using peripheral decoder and control circuitry for programming (writing), reading or erasing functions.

Prior art FIG. 2 represents a fragmentary cross section diagram of a typical memory cell 14 in the core region 11 of prior art FIGS. 1A and 1B. Such a cell 14 typically includes the source 14b, the drain 14a, and a channel 15 in a substrate or P-well 16; and the stacked gate structure 14c overlying the channel 15. The stacked gate 14c further includes a thin gate dielectric layer 17a (commonly referred to as the tunnel oxide) formed on the surface of the P-well 16. The stacked gate 14c also includes a polysilicon floating gate 17b which overlies the tunnel oxide 17a and an interpoly dielectric layer 17c overlies the floating gate 17b. The interpoly dielectric layer 17c is often a multilayer insulator such as an oxide-nitride-oxide (ONO) layer having two oxide layers sandwiching a nitride layer. Lastly, a polysilicon control gate 17d overlies the interpoly dielectric layer 17c. The control gates 17d of the respective cells 14 that are formed in a lateral row share a common word line (WL) associated with the row of cells (see, e.g., prior art FIG. 1B). In addition, as highlighted above, the drain regions 14a of the respective cells in a vertical column are connected together by a conductive bit line (BL). The channel 15 of the cell 14 conducts current between the source 14b and the drain 14a in accordance with an electric field developed in the channel 15 by the stacked gate structure 14c.

According to conventional operation, the flash memory cell 14 operates in the following manner. The cell 14 is programmed by applying a relatively high voltage $V_G$ (e.g., approximately 9 volts) to the control gate 17d and connecting the source to ground and the drain 14a to a predetermined potential above the source 14b (e.g., approximately 5 volts). These voltages generate a vertical and lateral electric field along the length of the channel from the source to the drain. This electric field causes electrons to be drawn off the source and begin accelerating toward the drain. As they move along the length of the channel, they gain energy. If they gain enough energy, they are able to jump over the potential barrier of the oxide into the floating gate 17b and become trapped in the floating gate 17b since the floating gate 17b is surrounded by insulators (the interpoly dielectric 17c and the tunnel oxide 17a). As a result of the trapped electrons, the threshold voltage of the cell 14 increases, for example, by about 2 to 5 volts. This change in the threshold voltage (and thereby the channel conductance) of the cell 14 created by the trapped electrons is what causes the cell to be programmed.

To read the memory cell 14, a predetermined voltage $V_G$ that is greater than the threshold voltage of an unprogrammed or erased cell, but less than the threshold voltage of a programmed cell, is applied to the control gate 17d with a voltage applied between the source 14b and the drain 14a (e.g., tying the source 14b to ground and applying about 1–2 volts to the drain 14a). If the cell 14 conducts (e.g., about 50–100 $\mu$A), then the cell 14 has not been programmed (the cell 14 is therefore at a first logic state, e.g., a zero "0"). Likewise, if the cell 14 does not conduct (e.g., considerably less current than 50–100 $\mu$A), then the cell 14 has been programmed (the cell 14 is therefore at a second logic state, e.g., a one "1"). Consequently, one can read each cell 14 to determine whether it has been programmed (and therefore identify its logic state).

A flash memory cell 14 can be erased in a number of ways. In one arrangement, a relatively high voltage Vs (e.g., approximately 12–20 volts) is applied to the source 14b and the control gate 17d is held at a ground potential ($V_G$=0), while the drain 14a is allowed to float. Under these conditions, a strong electric field is developed across the tunnel oxide 17a between the floating gate 17b and the source 14b. The electrons that are trapped in the floating gate undergo Fowler-Nordheim tunneling through the tunnel oxide 17a to the source 14b. In another arrangement, applying a negative voltage on the order of minus 10 volts to the control gate, applying 5 volts to the source and allowing the drain to float can also erase a cell. In a further arrangement, applying 5 volts to the P-well and minus 10 volts to the control gate while allowing the source and drain to float erases a cell.

In the NOR memory architecture of prior art FIG. 1B, the drain regions of cells along a given bit line are connected together via a conductive layer and contacts. The conductive layer can be, for example, a first metal layer. Source regions are typically connected by Vss or common source (CS) lines running parallel to the word lines and leading to a common ground. The Vss lines are formed typically by doping the semiconductor substrate. This NOR-type configuration has proven useful in building compact, high-speed flash memory devices, however, there has been a continuous demand to further reduce the size of these devices. In further reducing the size of flash memory devices, the resistance associated with the Vss lines has become an issue.

Various solutions employed to lower the Vss resistance have some undesirable consequences. For example, in order to form the Vss region via ion implantation, the field oxide regions (e.g., formed via either LOCOS or STI) that traverse the word lines (in the bit line direction) must be removed in those regions associated with the source regions of the cells. For example, as illustrated in prior art FIG. 3, the field oxide regions 30 (illustrated in this example as shallow trench isolation) extend in a bit line direction 32 and traverse two word line stacks 34 residing on a substrate 36, and are modestly thick (e.g., about 3,000 Angstroms) and therefore the removal thereof requires a substantially heavy etch. The etch process employed to remove the field oxide regions 30 is often referred to as a self-aligned source (SAS) etch and occurs subsequent to the stacked gate etch (SGE) which defines the memory cell stacks 34 along a given word line. The SAS etch is relatively heavy to remove the substantially thick field oxide regions in source regions 38, as illustrated in prior art FIG. 4, and consequently may tend to damage undesirably the sidewalls of the stacked gates.

In addition, as illustrated in prior art FIG. 5A, once the SAS etch has removed the field oxide regions 30 to expose the Vss regions along respective word lines, a Vss core implant (VCI) is performed to form a relatively low resistance Vss line thereat. The Vss region 38, however, is not planar due to the etched field oxide regions, as illustrated in FIG. 5A, and therefore in order to minimize the resistance of the Vss line, the VCI implant typically comprises three separate implant steps, wherein a generally vertical, and two angled implants are performed in order to uniformly dope the Vss region, as illustrated in prior art FIGS. 5A and 5B. Such multiple implants increase the complexity of the process and reduce throughput undesirably. In addition, the resistivity of the heavily doped areas are still relatively resistive and thus different source regions may reside at different potentials and such variations may have an adverse impact on memory operations. Thus, there has been an unsatisfied need for methods of further reducing the Vss or common source resistance in NOR-type flash memory devices.

SUMMARY OF THE INVENTION

The following presents a simplified summary of the invention in order to provide a basic understanding of some of its aspects. This summary is not an extensive overview of the invention and is intended neither to identify key or critical elements of the invention nor to delineate its scope. The primary purpose of this summary is to present some concepts of the invention in a simplified form as a prelude to the more detailed description that is presented later.

One aspect of the invention relates to a method of manufacturing a NOR-type flash memory device wherein the array of memory cells are arranged to have each source region (or at least a plurality of source regions) coupled together to form a common source. The method allows for the common source resistance to be decreased substantially while concurrently permitting a reduction in the word line-to-word line spacing.

The method comprises forming the array of memory cells and then covering the array with a first portion of an initial dielectric covering layer (e.g., ILD0). Contact holes are then formed down to the source regions, and a plurality of trenches are formed therein which extend between a plurality of the source contact holes, each along a given word line. Upon filling the contact holes and trenches with a conductive material such as metal, the source regions of cells along a given word line are electrically coupled together. Because the trenches may reside in the top portion of the initial dielectric covering layer above the memory cells, the trenches may have a substantial volume, thereby allowing the source line (e.g., Vss or common source) resistance to be extremely small without requiring additional area between word lines.

The method further comprises forming a second portion of the initial dielectric covering layer over the first dielectric portion, the filled contact holes and the filled trenches. Contact holes are then be formed through the first and second portions of the initial dielectric layer down to the drain regions of the memory cells, and a conductive material fills the contact holes to facilitate electrical contact thereto. Additional dielectric layers (e.g., ILD1) are then formed over the device and wiring patterns are formed therein to connect the drains of the cells to other cells and/or other circuitry as desired.

The present invention advantageously allows for the elimination of a self-aligned source (SAS) etch which was conventionally performed to remove isolation regions between source regions along a given word line. In addition, because each source region is coupled together via contacts and a conductive trench, multiple high dose implant steps which were conventionally employed to form a low resistance Vss are avoided, thereby reducing the complexity of the process. In addition, the present invention is equally applicable for different types of flash memory cells types such as stacked gate cells or SONOS type cells. Lastly, although the present invention is certainly advantageous for NOR-type architectures in which all the source regions are coupled together in a given sector or the entire core region, the present invention also finds applicability in other type architectures in which multiple source regions are to be connected together and a low resistance connection is desired.

According to still another aspect of the present invention, a NOR-type flash memory structure is disclosed. The memory structure comprises an array of memory cells arranged as columns of bit lines with rows of word lines traversing the bit lines. A first portion of an initial dielectric layer overlies the array and a plurality of source contact vias extend to source regions associated with cells in the array. The source contact vias are filled with conductive material such as metal and conductive lines couple the source regions together.

In one aspect, the conductive lines reside in trenches formed within the first portion of the dielectric layer, while in another aspect the conductive lines are formed on a top surface thereof. A second portion of the initial dielectric layer is then formed over the first portion and drain contact vias, which are filled with conductive material, extend therethrough down to drain regions. By having the source regions coupled together with conductive lines within the initial dielectric layer, a low resistance Vss or common source is formed without negatively impacting the word line-to-word line spacing.

Other advantages and novel features of the invention will become apparent from the following detailed description of the invention and the accompanying drawings. The detailed description of the invention and drawings provide exemplary embodiments of the invention. These exemplary embodiments are indicative of but a few of the various ways in which the principles of the invention can be employed.

BRIEF DESCRIPTION OF THE DRAWINGS

FIG. 1a is a plan view of a conventional flash memory device illustrating core regions and peripheral regions, respectively;

FIG. 1b is a schematic diagram illustrating a conventional NOR-type flash memory circuit architecture;

FIG. 2 is a cross section diagram illustrating a conventional stacked gate flash memory cell;

DETAILED DESCRIPTION OF THE INVENTION

Figure 3:
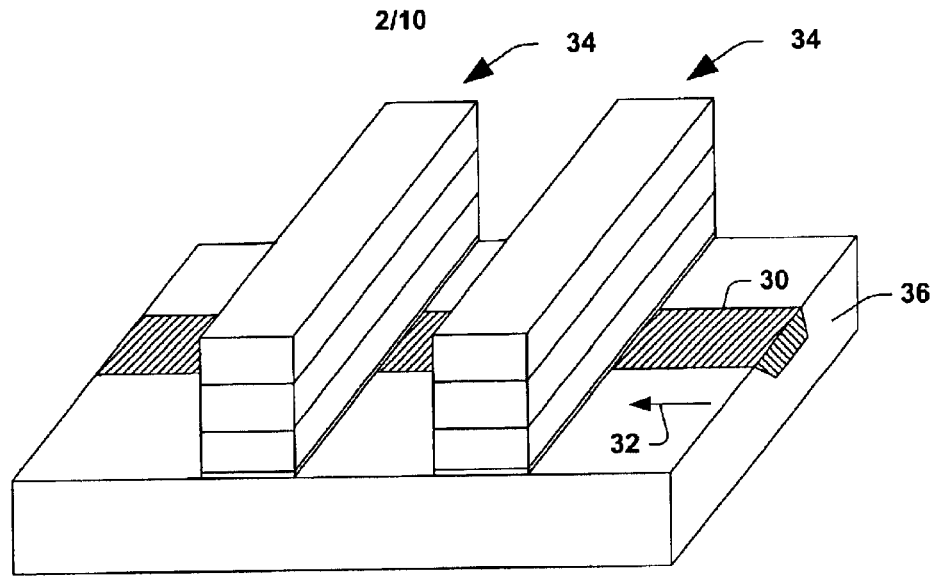
FIG. 3 is a prior art fragmentary perspective view of a portion of a flash memory wherein an isolation region traverses several word lines in a bit line direction.
Figure 4:
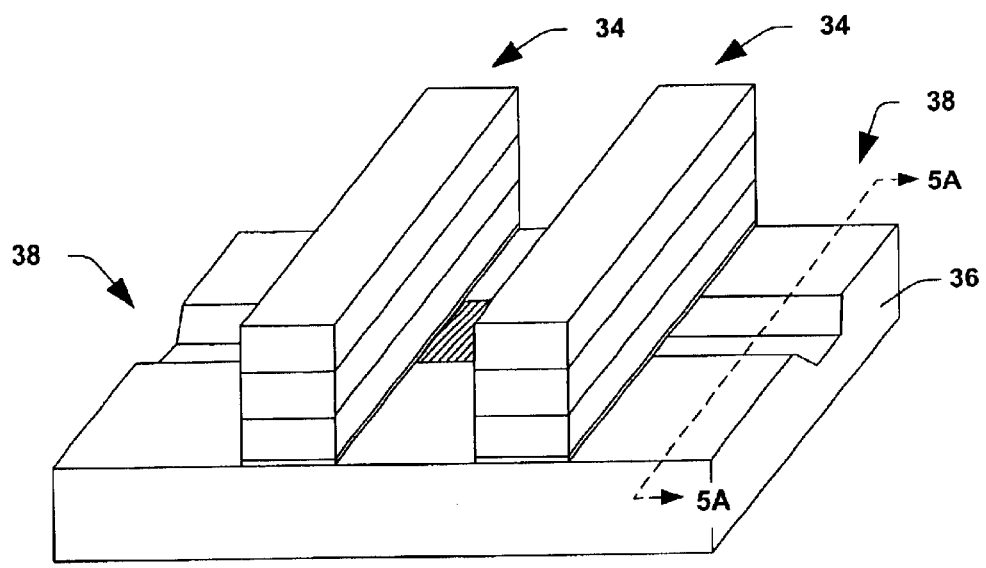
FIG. 4 is a prior art fragmentary perspective view of the portion of the flash memory of FIG. 3 after an SAS etch, wherein a portion of the isolation region has been removed in portions corresponding to subsequently formed source regions.

The present invention will now be described with reference to the drawings, wherein like reference numerals are used to refer to like elements throughout. The present invention relates to a method of forming a NOR-type flash memory device and an associated flash memory structure in which a plurality of source regions of memory cells in the array are coupled together to form a common source. The resistance of the common source is substantially reduced in the present invention over the prior art while concurrently reducing a complexity of the fabrication process and permitting a reduction in the word line-to-word line spacing.

The present invention achieves the above advantages by eliminating the SAS etch and multi-step VCI (Vss Core source Implants) and instead forms the source regions in a more conventional manner. The source regions are subsequently coupled together electrically by breaking up the initial dielectric layer (ILD0) overlying the memory cells into two portions, and forming source contact holes down to the source regions and trenches in or on the first portion which extend between the contact holes. By filling the contact holes and trenches with a conductive material such as metal, the source regions are electrically coupled together to form a common source.

Since a top of the first portion of the initial dielectric layer contains the trench and may exist above the memory cells, the trenches may be formed with a substantial volume, thereby allowing the conductive material therein to have a substantially low resistance. In addition, because the source regions are coupled together via contact holes through a substantially thin first portion dielectric (thinner than the entire ILD0), the contact holes may be relatively narrow (e.g., a small cross sectional area), thereby allowing the word line-to-word line spacing to be reduced which improves memory cell density in the core.

Figure 6:
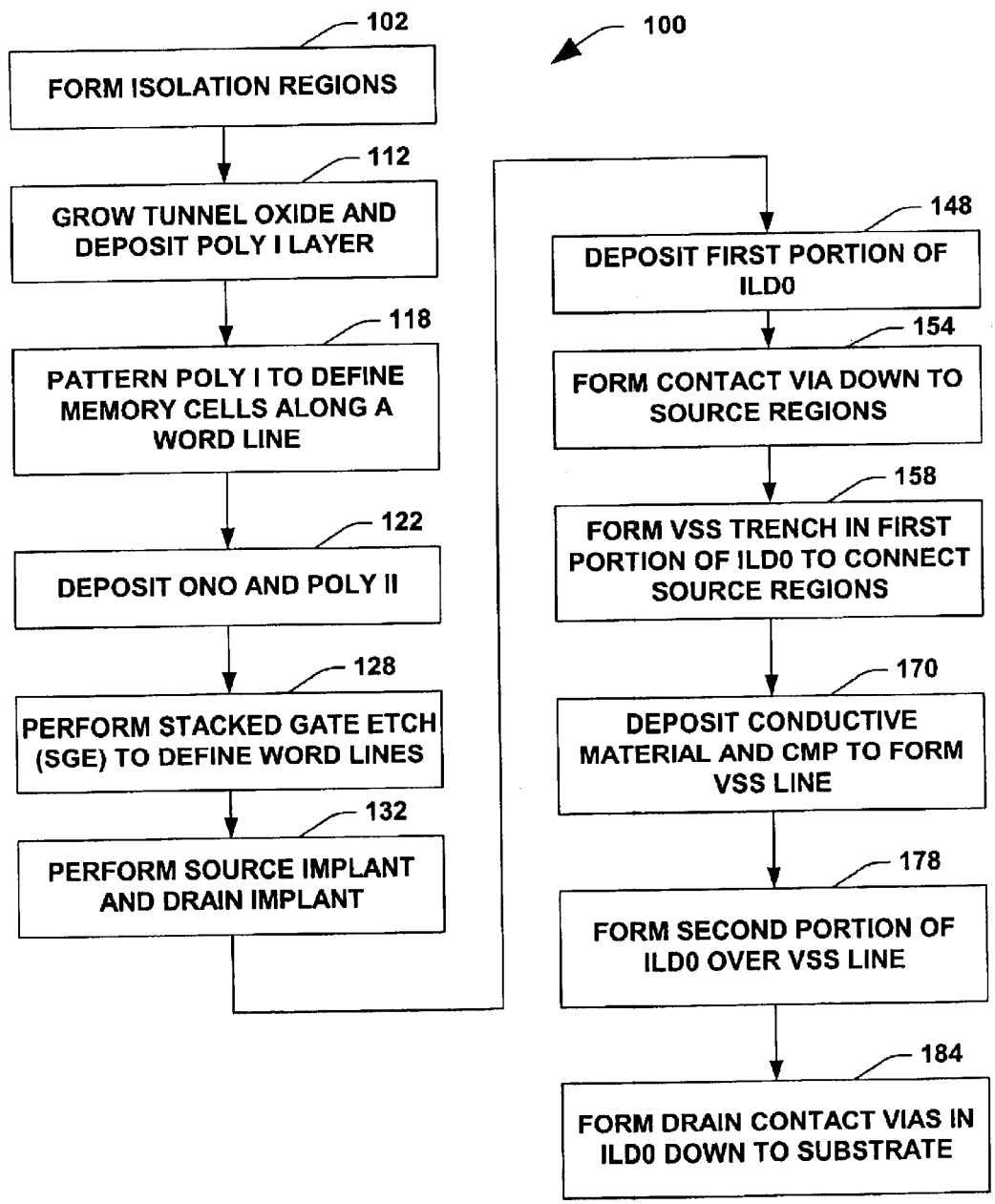
FIG. 6 is a flow chart diagram illustrating a method of forming a flash memory in accordance with one aspect of the present invention.

Turning now to the figures, FIG. 6 is a flow chart diagram illustrating an exemplary method of forming a NOR-type flash memory cell in accordance with one aspect of the present invention and is designated at reference numeral 100. Although the method 100 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention.

In addition, not all illustrated steps may be required to implement a methodology in accordance with the present invention. Furthermore, the methods according to the present invention may be implemented in association with the formation and/or processing of structures illustrated and described herein as well as in association with other structures not illustrated. For example, although the present example is provided in conjunction with a stacked gate type flash memory cell, the present invention is also applicable to SONOS type flash memory cells or other type memories, and such alternatives are contemplated as falling within the scope of the present invention.

Figure 7:
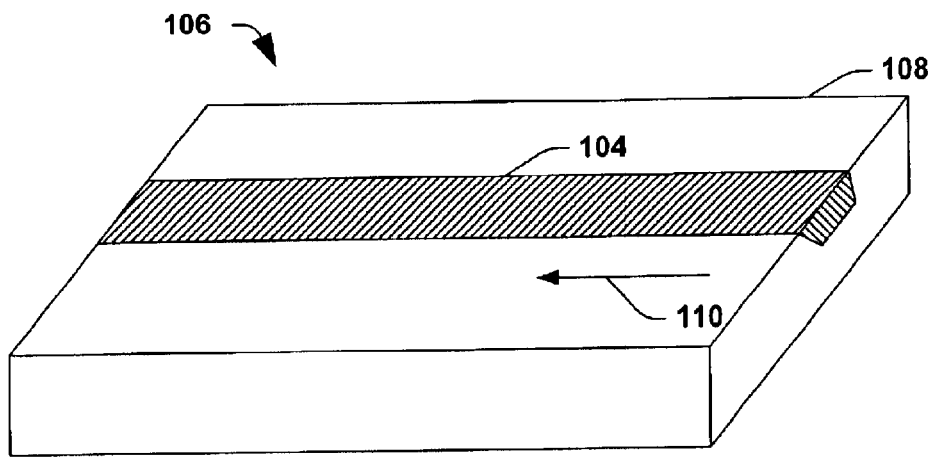
FIG. 7–13 are fragmentary perspective views of a portion of a core region in a flash memory in which a flash memory stack is formed with source and drain regions formed on opposite sides of the stack in accordance with an exemplary aspect of the present invention.

The method 100 of FIG. 6 will be described in conjunction with exemplary FIGS. 7–18. Initially, the method 100 begins at 102 with the formation of isolation regions. For example, as illustrated in FIG. 7, a plurality of isolation regions such as an isolation region 104 may be formed in a core region 106 of a semiconductor substrate 108. In the present example, such isolation regions 104 are formed via a shallow trench isolation (STI) process, however, other types of isolation such as field oxide regions formed by a LOCOS type methodology may also be employed and such alternatives are contemplated as falling within the scope of the present invention. In the present example, the isolation regions 104 extend in a bit line direction 110.

Figure 8:
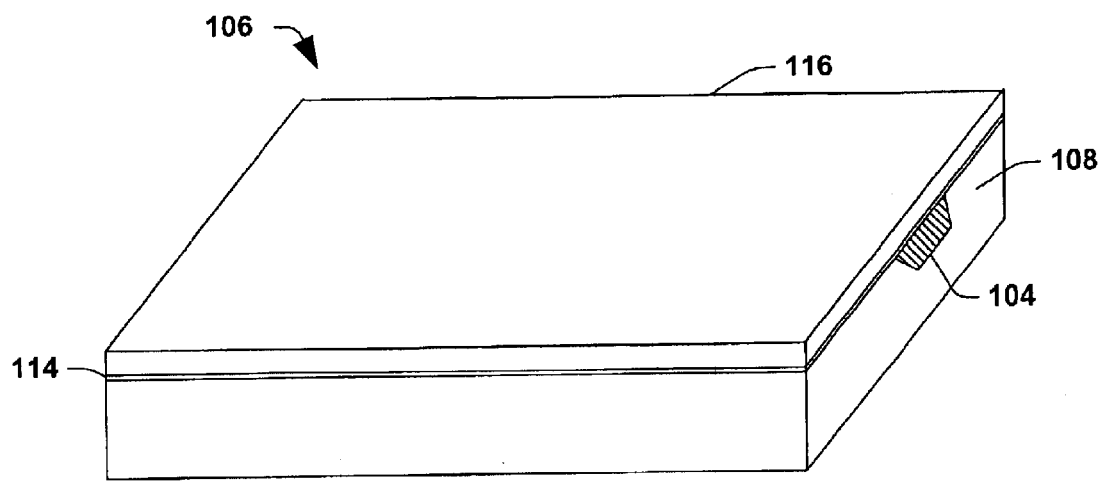

At 112 of FIG. 6, a tunnel oxide 114 and a floating gate layer 116 are formed over the semiconductor substrate 108, as illustrated in FIG. 8. For example, the tunnel oxide 114 is formed via a thermal oxidation process, however, other fabrication methods may be employed. In addition, the floating gate layer 116 in the present example, may be a polysilicon layer formed via chemical vapor deposition (CVD), however, other conductive materials may be utilized and such alternatives are contemplated as falling within the scope of the present invention.

Figure 9:
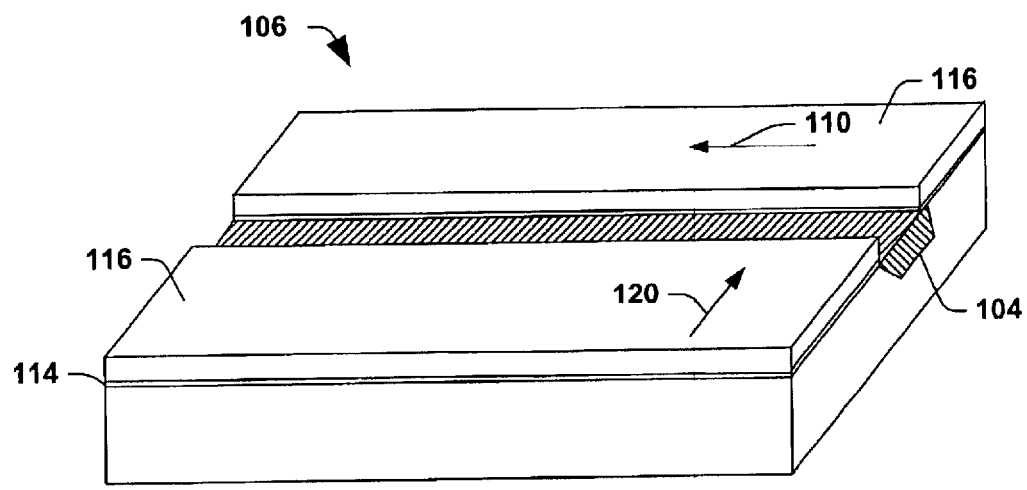
Figure 10:
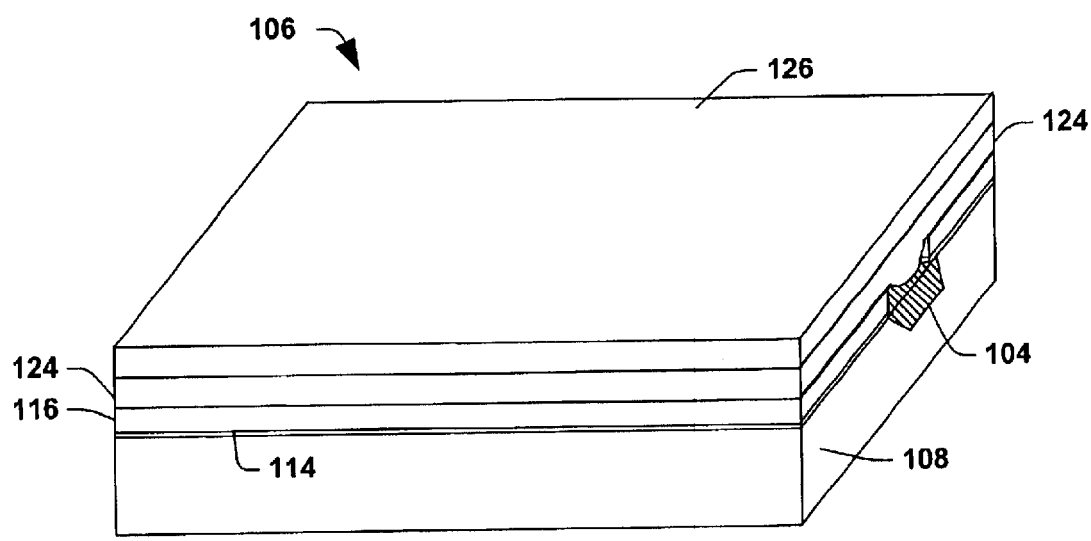

The method 100 of FIG. 6 continues at 118, wherein the floating gate layer 116 (e.g., poly I) is patterned in such a manner to define a plurality of memory cells along a given word line (not yet shown). In one example, as illustrated in FIG. 9, the poly I 116 is patterned by a dry etch (e.g., reactive ion etching (RIE)) to expose a portion of the underlying isolation regions 104 in the bit line direction 110, however, the tunnel oxide 114 in some cases may still overlie the isolation regions 104. Therefore portions of the poly I 116 are isolated from one another along a word line direction 120. Act 118 of FIG. 6 is then followed by the formation of an interlayer dielectric 124 (e.g., an oxide-nitride-oxide (ONO) layer) and a conductive control gate layer 126 (e.g., a second polysilicon or poly II layer) at 122 via any one of a number of deposition techniques, as illustrated in FIG. 10.

Figure 11:
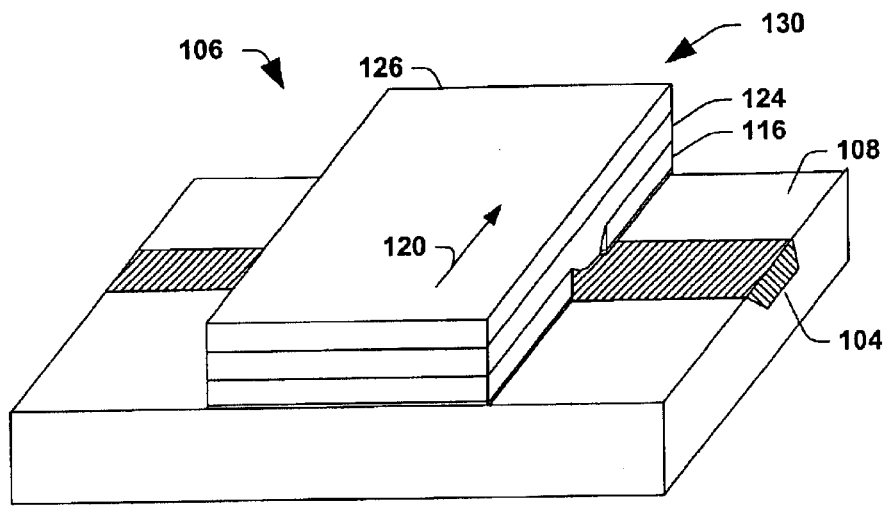

Once the memory cell layers have been formed in the core region 106, a stacked gate etch is performed at 128 of FIG. 6 to etch the control gate layer 126, the interpoly dielectric 124 and the floating gate layer 116 along the word line direction 120 to define a plurality of stacks 130, as illustrated in FIG. 11. Typically the stacked gate etch (SGE) is employed to etch a large number of such stacks to define the word lines, wherein the control gate layer 126 forms both a common word line and a word line contact for a number of memory cells along the given word line.

Figure 12:
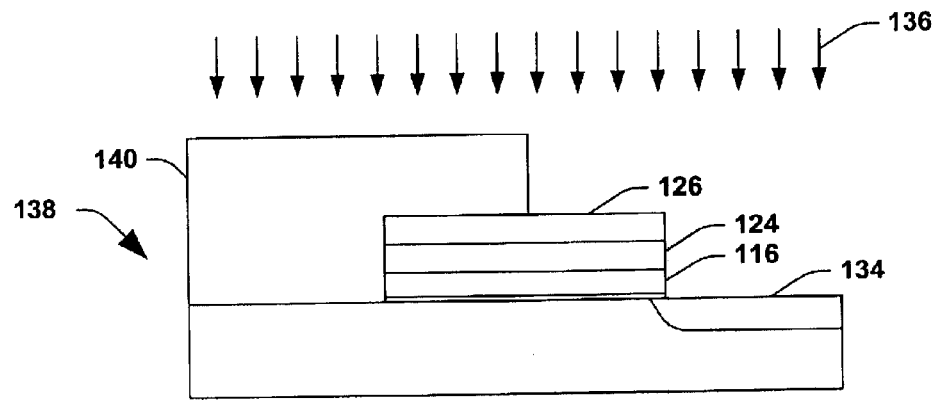
Figure 13:
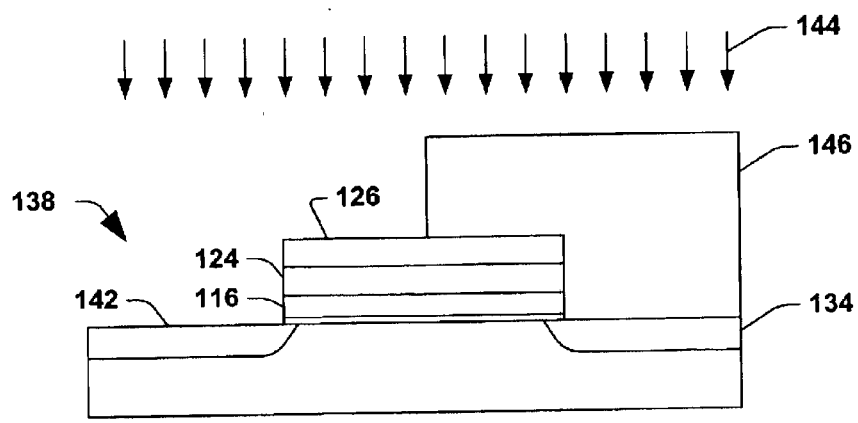

The method 100 of FIG. 6 continues at 132, wherein source and drain regions are formed in the semiconductor substrate 108, for example, via ion implantation. In accordance with one exemplary aspect of the present invention, the source and drain regions are formed separately in order to customize the regions, however, in an alternative example, such regions may be formed concurrently. As illustrated in FIG. 12, a source region 134 is formed via ion implantation 136 while a drain location 138 is blocked from implantation with a mask 140 such as a patterned photoresist. Event 132 then may continue as illustrated in FIG. 13, wherein a drain region 142 is formed in the drain locations 138 via, for example, ion implantation 144, while the source regions 134 are blocked from implantation via a mask 146. The ion implantation 144 is illustrated as a non-angled implant, however, such implantation may comprise an angled implant to provide an extension region associated with the drain region 142 to minimize short channel effects, as may be desired.

Figure 5A:
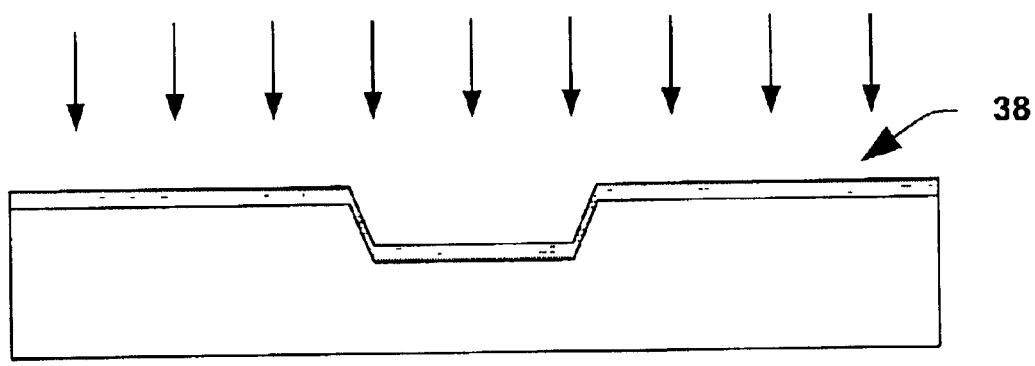
FIG. 5A is prior art fragmentary cross sectional diagram of the flash memory of FIG. 4 taken along the dotted line 5A—5A, wherein a source implant is performed to form a common source line in the source regions.
Figure 5B:
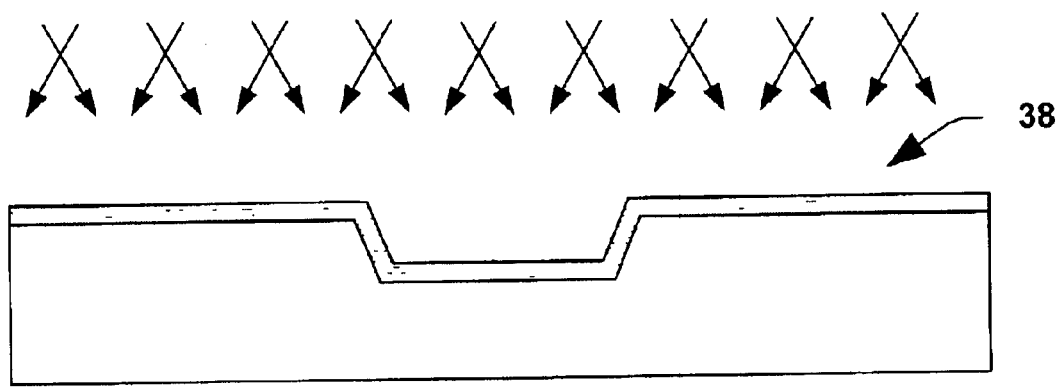
FIG. 5B is prior all fragmentary cross sectional diagram of the flash memory of FIG. 5A, wherein additional angled source implants are performed to form a relatively low resistance common source line in the source regions.

Note that in event 132, the source region 134 may be formed via a standard type implant without providing multiple implants or extremely heavy dose implants as was typical in prior art processes (see, e.g., prior art FIG. 5B) in order to minimize the Vss or common source resistance. As will be readily seen in the subsequent discussion, the present invention provides for a simple method and structure which provides for a low resistance Vss or common source resistance without the complexity or cost of the prior art.

Figure 14:
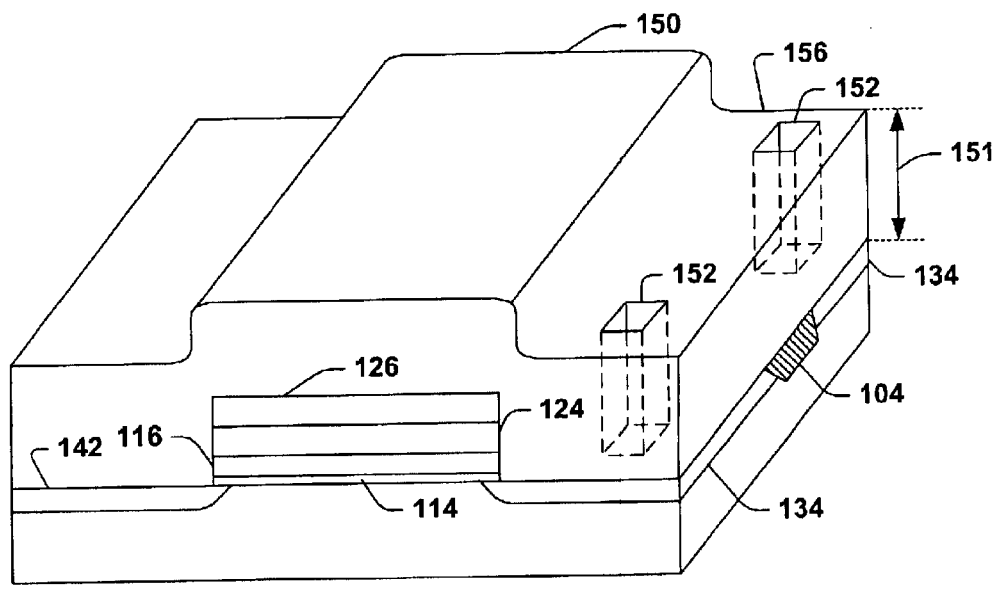
FIG. 14 is a fragmentary perspective view of a first portion of a first dielectric layer formed over the stack with contact holes formed therein down to the source regions along a given word line in accordance with the present invention.

The fabrication of the NOR-type flash memory continues at 148 of FIG. 6, wherein a first portion 150 of a dielectric layer is formed over the semiconductor substrate 108, as illustrated in FIG. 14. In contrast to prior art processes in which a substantially thick layer of dielectric is deposited (e.g., about 15,000 Angstroms to about 17,000 Angstroms), the first portion 150 of the initial dielectric layer (ILD0$_1$) is deposited to a lesser thickness 151, for example, about 4,000 Angstroms or more and about 8,000 Angstroms or less. A plurality of source region contact vias 152 are then formed in the first portion of dielectric 150 at 154 of FIG. 6, and such exemplary contact vias 152 are illustrated in FIG. 14. Note that the vias 152 extend from a top portion 156 of the first dielectric portion 150 down to the source regions 134 in the substrate 108 and such contact vias 152 extend along the word line direction 120 as illustrated.

Note that since the first portion 150 of ILD0 is less than the full ILD0 thickness, the source contact vias 152 do not need to have to be substantially large because the aspect ratio thereof is not excessive. By allowing the vias 152 to be small in cross sectional area, the word line-to-word line spacing between the stacks 130 may be reduced which increases memory cell density.

Figure 15:
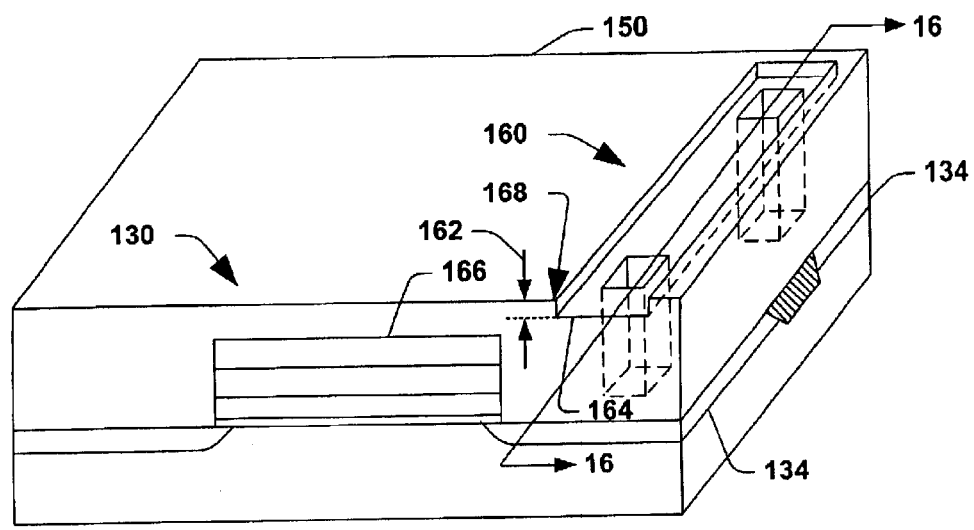
FIG. 15 is a fragmentary perspective view of the first portion of the first dielectric layer with a trench formed therein and extending between the source contact holes in accordance with the present invention.
Figure 16:
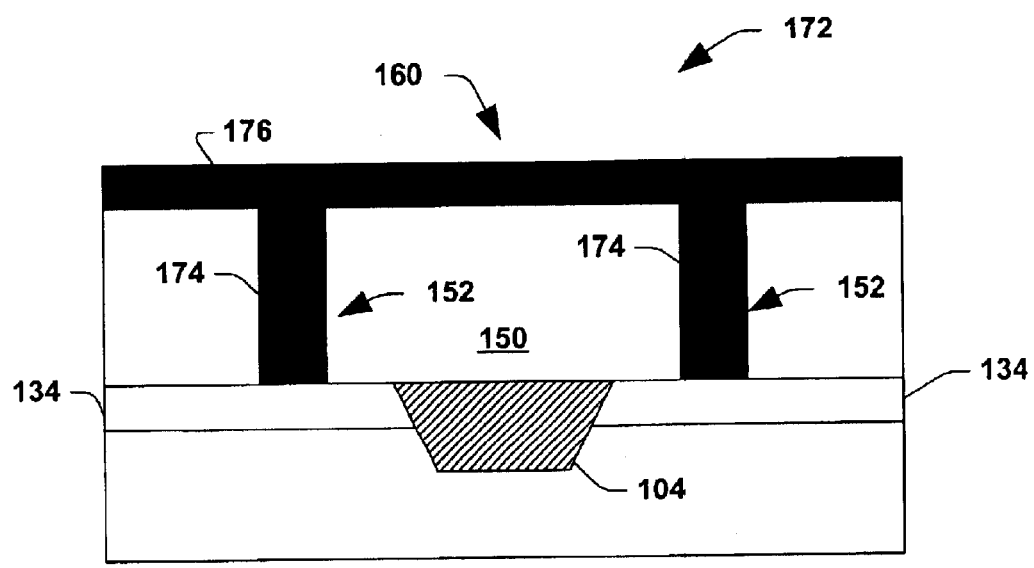
FIG. 16 is a fragmentary cross sectional diagram of the flash memory of FIG. 15 taken along line 16—16, wherein the source contact holes and trench are filled with a conductive material in accordance with the present invention.

A trench is then formed in the first dielectric portion 150 at 158 of FIG. 6, wherein the trench extends in the word line direction 120 between the contact vias, as illustrated, for example, in FIG. 15 and designated at reference numeral 160. As illustrated in FIG. 15, the formation of the trench 160 may occur subsequent to a planarization (e.g., CMP) of the to surface 156 of the first dielectric portion 150, however, such planarization is not required. The formation of the trench 160 in conjunction with the source contact vias 152 may be formed in a manner similar to a dual damascene type process, however, any manner of forming the vias 152 and trenches 160 may be employed and is contemplated as falling within the scope of the present invention.

In FIG. 15, the trench 160 is illustrated with a depth designated at reference numeral 162. Preferably, the depth 162 of the trench is small enough such that a bottom portion 164 of the trench 160 does not fall below a top portion 166 of the stack 130 which is typically about 3,500 Angstroms high. In such manner, a side edge 168 of the trench 160 may extend over the stack 130, thereby allowing the connections between the source regions 134 to occupy a substantial area and allow the resistance thereof to be substantially small. Alternatively, if the side edge 168 of the trench 160 is not made to extend over the stack 130, a depth 162 thereof may be made substantially large, and in one extreme example, extend all the way down to the substrate 108, wherein the formation of source contact vias 152 and the trench 160 merge into one act or event.

Figure 18:
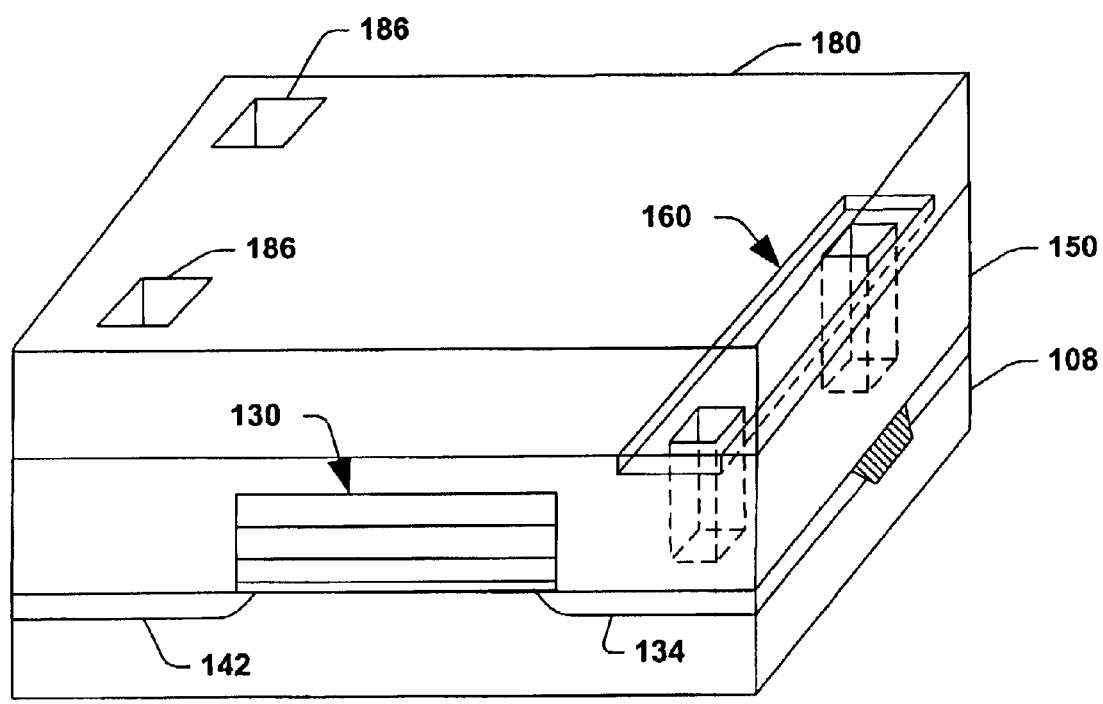
FIG. 18 is a fragmentary cross sectional diagram illustrating the flash memory of FIG. 17, wherein drain contact holes are formed in the second portion of the first dielectric layer down to the drain regions along a given word line in accordance with the present invention.

Note that in FIGS. 15 and 18, the trenches 160 are illustrated as extending solely in the word line direction 120. In addition, at least one trench (not shown) will traverse the generally parallel trenches 160 (e.g., in the bit line direction 110) and thereby couple the multiple trenches together. In the above manner, all the source regions of a given sector, or even the entire array, may be coupled together to form a common source (CS) having a low resistance associated therewith.

The method 100 of FIG. 6 then continues at 170, wherein a conductive material is formed in the source contact vias 152 and trenches 160 to form a low resistance Vss or common source line. For example, the conductive material in the vias 152 may comprise tungsten and in the trench may comprise aluminum or copper, although any conductive material may be employed, and such formation may comprise a blanket deposition such as CVD or sputtering, followed by a planarization. Such processing may result in the structure 172 illustrated in FIG. 16 which illustrates the memory device of FIG. 15 taken along line 16—16. Note that the structure 172 comprises a conductive interconnect between the source regions 134 via the filled source contact vias 152 (now forming source contacts 174 and the filled trench 160, now forming the Vss or common source 176.

Since the source contact vias 152 are employed to contact together multiple source regions, the contact vias do not need to be large in cross sectional area. Therefore the stack-to-stack spacing corresponding to the word line-to-word line spacing may be reduced, which improves cell density in the core region. In addition, since the volume of the common source 176 may be made substantially large and may comprise a high conductivity material such as metal, the common source resistance is substantially small. In addition, although the Vss or common source 176 in one example is formed in the trench 160 within the first portion 150, the common source 176 may alternatively be formed on top of the first portion 150 via a blanket conductive layer deposition followed by patterning, and such an alternative is contemplated as falling within the scope of the present invention.

Figure 17:
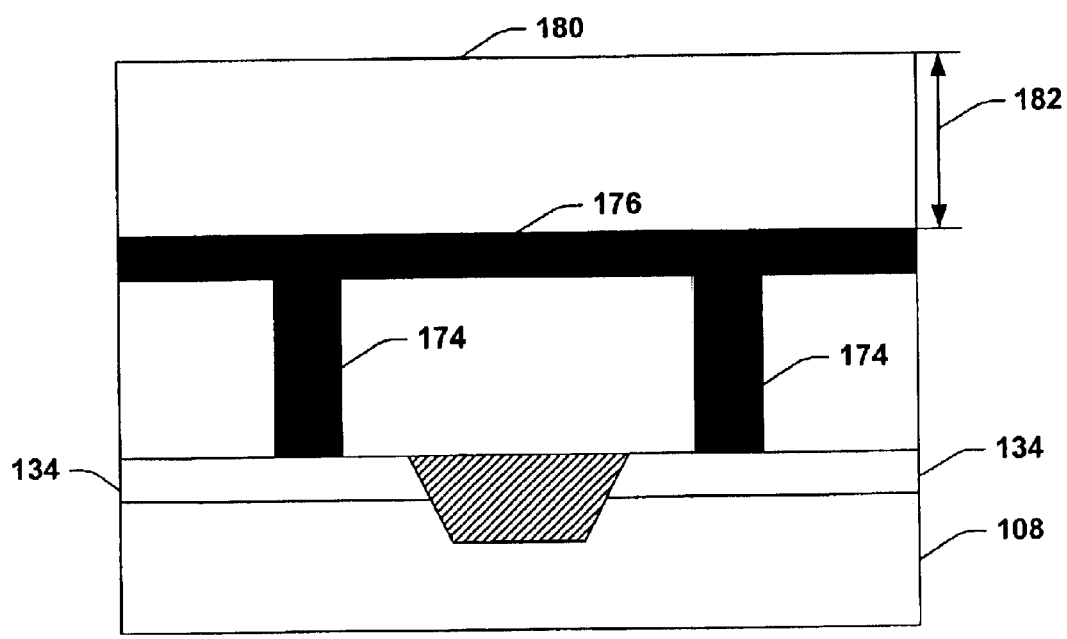
FIG. 17 is a fragmentary cross sectional diagram of the flash memory of FIG. 16 with a second portion of the first dielectric layer formed over the trench and source contacts in accordance with the present invention.

The method 100 of FIG. 6 then continues at 178, wherein a second portion 180 of the initial dielectric layer ($ILD0_2$) is formed over the semiconductor substrate 108, as illustrated in FIG. 17. Note that a thickness 182 of the second dielectric portion 180 may comprise about 10,000 Angstroms such that the first and second portions 150, 180 ($ILD0_1+ILD0_2$) together comprise what is typically the initial dielectric layer (ILD0) prior to standard metallization of about 16,000 Angstroms or more. That is, the ILD0 is what is typically formed over the stacks 130 prior to standard metallization (e.g., first layer of metal or M1). In the present invention, the ILD0 is broken into two parts: the first portion 150 and the second portion 180, wherein a Vss or common source metallization is employed therebetween (e.g., within or on top of the first portion 150) to form a low resistance common source for the NOR array prior to the standard first metallization, thereby embedding the Vss or common source line within ILD0.

Returning to FIG. 6, the method 100 continues at 184, wherein drain contact vias 186 are formed through the first and second portions 150, 180 comprising the ILD0 down to the drain regions 142, as illustrated in FIG. 18. The drain contact vias 186 are then filled with a conductive material, for example, metal in conjunction with standard processing of a first metallization layer (e.g., M1), to thereby connect various drain regions to select bit lines, control circuitry, etc. In this example, the drain connections are formed independently of the source connections, however, alternatively, drain contacts may be formed in two steps; first with the source contact through the $ILD0_1$, and then again later through the $ILD0_2$, as may be desired.

In accordance with another aspect of the present invention, a NOR-type flash memory architecture structure is provided in which the Vss line or common source is embedded within the initial dielectric layer overlying the memory cells (e.g., ILD0). The structure, as illustrated, for example, in FIG. 18 comprises a flash memory cell (e.g., a stacked gate cell or a SONOS cell) having contacts extending down to the source region and up to an intermediate region in the ILD0 layer (e.g., a first portion of the ILDO, such as an $ILDO_1$). A conductive layer electrically connects the source regions together by coupling to the source contacts, for example, in the word line direction 120, and the conductive layer (e.g., structure 176) is covered by a second portion of the ILD0 (e.g., $ILD0_2$). Drain contacts extend through both portions 150, 180 of the ILD0 to the various drain regions for electrical connection of such regions to other cells, control circuitry, etc. The embedded Vss line 176 provides for a substantial reduction in Vss or common source resistance and does not interfere with the drain metallization thereabove. In addition, the structure eliminates the need for a VCI implant and provides for reduced word line-to-word line spacing.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description and the claims, such terms are intended to be inclusive in a manner similar to the term "comprising."

What is claimed is:

1. A method of forming a NOR-type flash memory, comprising:

forming a flash memory array on a semiconductor substrate in a core region of the flash memory, the flash memory array having a plurality of flash memory cells each having a source region and a drain region in the semiconductor substrate;

forming a first dielectric layer over the flash memory array;

forming two contact holes in the first dielectric layer down to source regions of two flash memory cells in the core region extending along a word line;

forming a trench in the first dielectric layer extending between the two contact holes along the word line;

filling the two contact holes and the trench with a conductive material, thereby electrically coupling together the source regions of the two flash memory cells; and forming a second dielectric layer over the first dielectric layer and the trench.

2. The method of claim 1, wherein the array of flash memory cells in the core region comprise an array of flash memory cells arranged in rows and columns, wherein the rows correspond to word lines and columns correspond to bit lines, respectively, and wherein the source regions of all the flash memory cells in the array are coupled together to form a common source line, further comprising:

patterning a plurality of contact holes in the first dielectric layer down to each source region in the array; and patterning a plurality of trenches in the first dielectric layer, wherein each trench extends to a plurality of contact holes associated with source regions of flash memory cells along a given word line;

filling the plurality of contact holes and trenches, thereby electrically coupling together each of the plurality of source regions associated with a given word line.

3. The method of claim 2, further comprising:

forming another trench in the first dielectric layer extending in a direction which traverses the plurality of trenches; and filling the another trench with a conductive material, thereby electrically coupling together the plurality of trenches extending along the word lines and electrically coupling together each of the source regions in the array and forming a common source.

4. The method of claim 1, wherein a thickness of the first dielectric layer is about 4,000 Angstroms or more and about 8,000 Angstroms or less.

5. The method of claim 4, wherein a combined thickness of the first and second dielectric layers is about 16,000 Angstroms.

6. The method of claim 1, further comprising:

forming a plurality of contact holes down through the first and second dielectric layers to the plurality of drain regions in the core region; and filling the plurality of contact holes extending down to the drain regions with conductive material.

7. The method of claim 6, further comprising:

forming a third dielectric layer over the second dielectric layer;

patterning the third dielectric layer to define a plurality of wiring patterns associated with the drain regions of the flash memory cells in the core region; and filling the wiring patterns with a conductive material for connection of the drain regions of the flash memory cells in the core region to other cells or circuitry.

8. The method of claim 1, wherein filling the contact holes and the trench with a conductive material comprises:

forming a layer of conductive material over the first dielectric layer; and planarizing the layer of conductive material down to a top surface of the first dielectric layer.

9. The method of claim 1, wherein the flash memory cells in the core region are one of a stacked gate flash memory cell and a SONOS flash memory cell.

10. A method of forming a NOR-type flash memory, comprising:

forming isolation regions in a surface of a semiconductor substrate in a core region, the isolation region extending in a bit line direction;

forming memory cell layers over the semiconductor substrate in the core region, the memory cells layers overlying the isolation regions;

patterning the memory cell layers to form a plurality of flash memory cells in an array, wherein the array comprises a plurality of bit line columns extending in the bit line direction and a plurality of word line rows extending in a word line direction which traverses the bit line direction;

forming source and drain regions in the semiconductor substrate associated with each of the flash memory cells in the array, wherein the source regions are separated from one another by the isolation regions along the word line direction;

forming a first dielectric layer over the flash memory cells in the core region, thereby covering the source and drain regions in the semiconductor substrate;

forming a plurality of contact holes through the first dielectric layer down to a plurality of source regions of memory cells along a given word line;

forming a trench in the first dielectric layer extending along the word line direction to the plurality of contact holes;

filling the plurality of contact holes and the trench with a conductive material, thereby electrically coupling the plurality of source regions along the given word line together;

forming a second dielectric layer over the first dielectric layer, and the conductive material in the contact holes and the trench.

11. The method of claim 10, further comprising:

forming a plurality of contact holes through the first dielectric layer down to each of the source regions in the core region;

forming a plurality of trenches in the first dielectric layer, wherein each of the trenches extend to contact holes along a respective word line; and filling the plurality of contact holes and the plurality of trenches with a conductive material, thereby electrically coupling together each of the source regions along the respective word lines.

12. The method of claim 11, further comprising:

forming another trench which traverses the plurality of trenches; and filling the another trench with the conductive material, thereby electrically coupling together each of the plurality of trenches, resulting in each of the source regions in the core region being electrically coupled together to form a common source.

13. The method of claim 10, further comprising:

forming a plurality of contact holes extending through the first and second dielectric layers down to the plurality of drain regions; and filling the plurality of contact holes extending down to the drain regions with a conductive material.

14. The method of claim 13, further comprising:

forming a third dielectric layer over the first dielectric layer;

patterning the third dielectric layer to define a plurality of wiring patterns associated with the drain regions of the flash memory cells in the core region; and filling the wiring patterns with a conductive material for connection of the drain regions of the flash memory cells in the core region to other cells or circuitry.

15. The method of claim 10, wherein filling the contact holes and the trench with a conductive material comprises:

forming a layer of conductive material over the first dielectric layer; and planarizing the layer of conductive material down to a top surface of the first dielectric layer.

16. The method of claim 10, wherein the flash memory cell comprises a stacked gate flash memory cell, and wherein forming and patterning the memory cell layers comprises:

forming a tunnel oxide layer over the semiconductor substrate in the core region;

forming a floating gate layer over the tunnel oxide layer;

patterning the floating gate layer in the bit line direction, thereby removing a portion of the floating layer and exposing a portion of the isolation regions;

forming an interlayer dielectric over the patterned floating gate layer;

forming a control gate layer over the interpoly dielectric; and patterning the control gate layer, the interpoly dielectric and the floating gate layer to form a plurality of stacks extending in a word line direction, wherein the word line direction is generally perpendicular to the bit line direction, thereby isolating the floating gate layer portions into a plurality of regions, wherein each floating gate layer region corresponds to a memory cell along a given word line.

17. The method of claim 10, wherein the flash memory cell comprises a SONOS cell, and wherein forming and patterning the memory cell layers comprises:

forming a charge trapping layer over the semiconductor substrate in the core region;

forming a control gate layer over the charge trapping layer; and patterning the control gate layer to form the plurality of memory cells arranged in the array of bit lines and word lines.

18. The method of claim 10, wherein a thickness of the first dielectric layer is about 4,000 Angstroms or more and about 8,000 Angstroms or less.

19. The method of claim 18, wherein a combined thickness of the first and second dielectric layers is about 16,000 Angstroms.

20. A NOR-type flash memory cell structure, comprising:

an array of flash memory cells arranged in columns of bit lines and rows of word lines, respectively, wherein each of the flash memory cells comprise a drain region and a source region, and where the source regions of flash memory cells along a word line are separated from one another by isolation regions;

a first dielectric layer overlying the array of flash memory cells; and a conductive common source line embedded within the first dielectric layer and extending both in the word line direction and down and making conductive contact to the source regions of the flash memory cells along the word line direction, thereby electrically coupling together the source regions to form a substantially low resistance common source line.

21. A NOR-type flash memory cell structure, comprising:

an array of flash memory cells arranged in columns of bit lines and rows of word lines, respectively, wherein each of the flash memory cells comprise a drain region and a source region;

a first dielectric layer overlying the array of flash memory cells; and a conductive common source line embedded within the first dielectric layer and extending down and making conductive contact to the source regions of the flash memory cells, thereby electrically coupling together the source regions to form a substantially low resistance common source line, wherein the conductive common source line comprises a plurality of conductive contacts extending through the first dielectric layer to the source regions, and a plurality of first generally laterally extending conductive common source structures extending between source regions along respective word lines, thereby coupling together source regions along the respective word lines.

22. The structure of claim 21, wherein the conductive common source line further comprises a second generally laterally extending conductive common source structure traversing the plurality of first common source structures, thereby electrically coupling together the source regions associated with the plurality of first common source structures.

23. The structure of claim 21, further comprising drain contacts extending through an entire portion of the first dielectric layer to the drain regions of the flash memory cells within the array.

24. A method of forming a NOR-type flash memory array, comprising:

forming an array of flash memory cells arranged in columns of bit lines and rows of word lines, respectively, wherein each of the flash memory cells comprise a drain region and a source region;

forming a first dielectric layer over the array of flash memory cells; and embedding a conductive common source structure within the first dielectric layer, wherein the conductive common source structure extends along the word line direction makes contact down to the source regions of the flash memory cells and electrically couples the separated source regions together along the given word line to form a common source of the array.

25. The method of claim 24, wherein the conductive common source structure extends generally parallel to the given word line.

* * * * *